(12) United States Patent
Chiu et al.

(10) Patent No.: US 7,355,283 B2
(45) Date of Patent: Apr. 8, 2008

(54) RIGID WAVE PATTERN DESIGN ON CHIP CARRIER SUBSTRATE AND PRINTED CIRCUIT BOARD FOR SEMICONDUCTOR AND ELECTRONIC SUB-SYSTEM PACKAGING

(75) Inventors: Chin-Tien Chiu, Taichung (TW); Chih-Chin Liao, Changhua (TW); Ken Jian Ming Wang, San Francisco, CA (US); Han-Shiao Chen, Da-an Township, Taichung County (TW); Cheemen Yu, Madison, WI (US); Hem Takiar, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/106,699

(22) Filed: Apr. 14, 2005

(65) Prior Publication Data

US 2006/0231943 A1 Oct. 19, 2006

(51) Int. Cl.
*H01L 23/48* (2006.01)
*H01R 9/00* (2006.01)
*H05K 1/11* (2006.01)

(52) U.S. Cl. .............. 257/773; 257/786; 361/772; 361/774; 361/777; 174/261

(58) Field of Classification Search ............ None
See application file for complete search history.

(56) References Cited

U.S. PATENT DOCUMENTS

| | | | |
|---|---|---|---|
| 5,434,106 A | 7/1995 | Lim et al. | |
| 5,468,655 A * | 11/1995 | Greer | 438/15 |
| 5,686,356 A | 11/1997 | Jain et al. | |
| 5,866,950 A * | 2/1999 | Iwasaki et al. | 257/782 |
| 6,245,597 B1 | 6/2001 | Fernandez | |
| 6,365,966 B1 * | 4/2002 | Chen et al. | 257/723 |
| 6,449,748 B1 | 9/2002 | Jeng et al. | |
| 6,497,943 B1 * | 12/2002 | Jimarez et al. | 428/209 |
| 6,551,862 B2 * | 4/2003 | Oota et al. | 438/118 |
| 6,720,209 B2 * | 4/2004 | Igarashi et al. | 438/126 |
| 6,992,380 B2 * | 1/2006 | Masumoto | 257/709 |
| 7,138,706 B2 * | 11/2006 | Arai et al. | 257/678 |
| 2002/0070462 A1 * | 6/2002 | Fujisawa et al. | 257/780 |
| 2002/0093084 A1 * | 7/2002 | Horiike et al. | 257/679 |
| 2002/0094679 A1 | 7/2002 | Song et al. | |
| 2003/0153159 A1 | 8/2003 | Contopanagos et al. | |

FOREIGN PATENT DOCUMENTS

EP  0 924 762  6/1999

OTHER PUBLICATIONS

U.S. Appl. No. 11/930,816, filed Oct. 31, 2007.

* cited by examiner

*Primary Examiner*—Alonzo Chambliss
(74) *Attorney, Agent, or Firm*—Vierra Magen Marcus & DeNiro LLP

(57) ABSTRACT

A rigid wave pattern formed on a first side of a substrate in a semiconductor die package. The rigid wave pattern aligns with and overlies the contact fingers formed on the second side of the substrate. When the substrate and dice are encased during the molding process, the rigid wave pattern effectively reduces deformation of and stresses on the dice, therefore substantially alleviating die cracking.

12 Claims, 10 Drawing Sheets

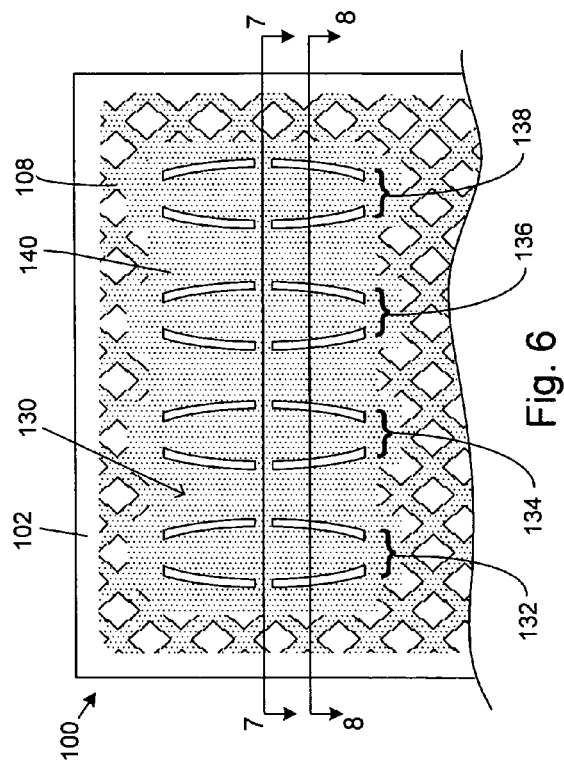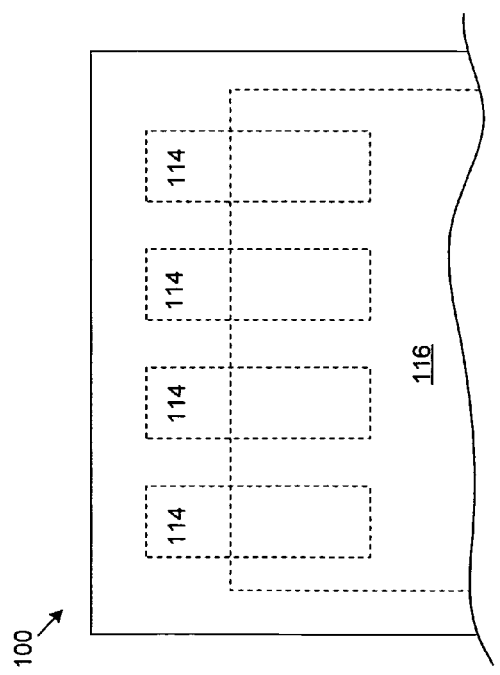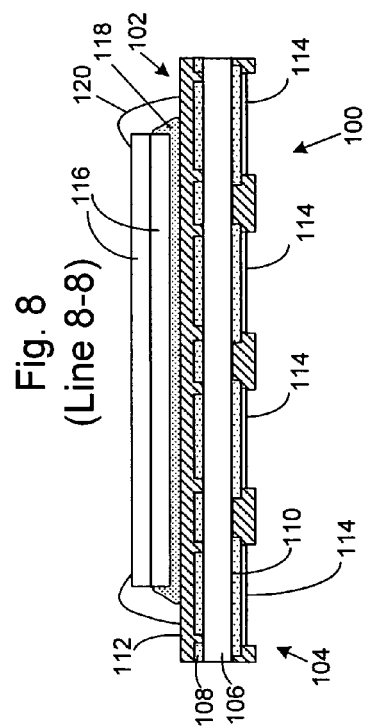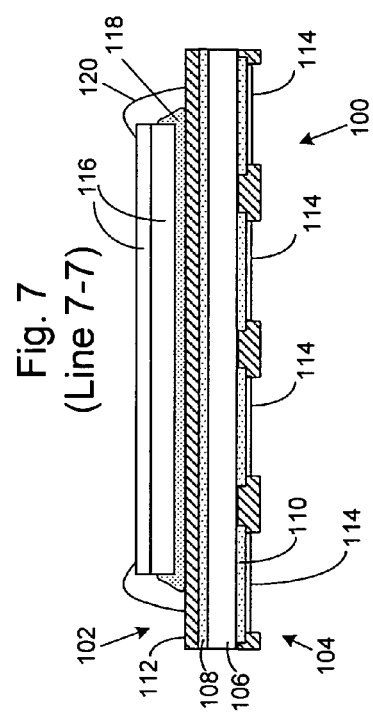

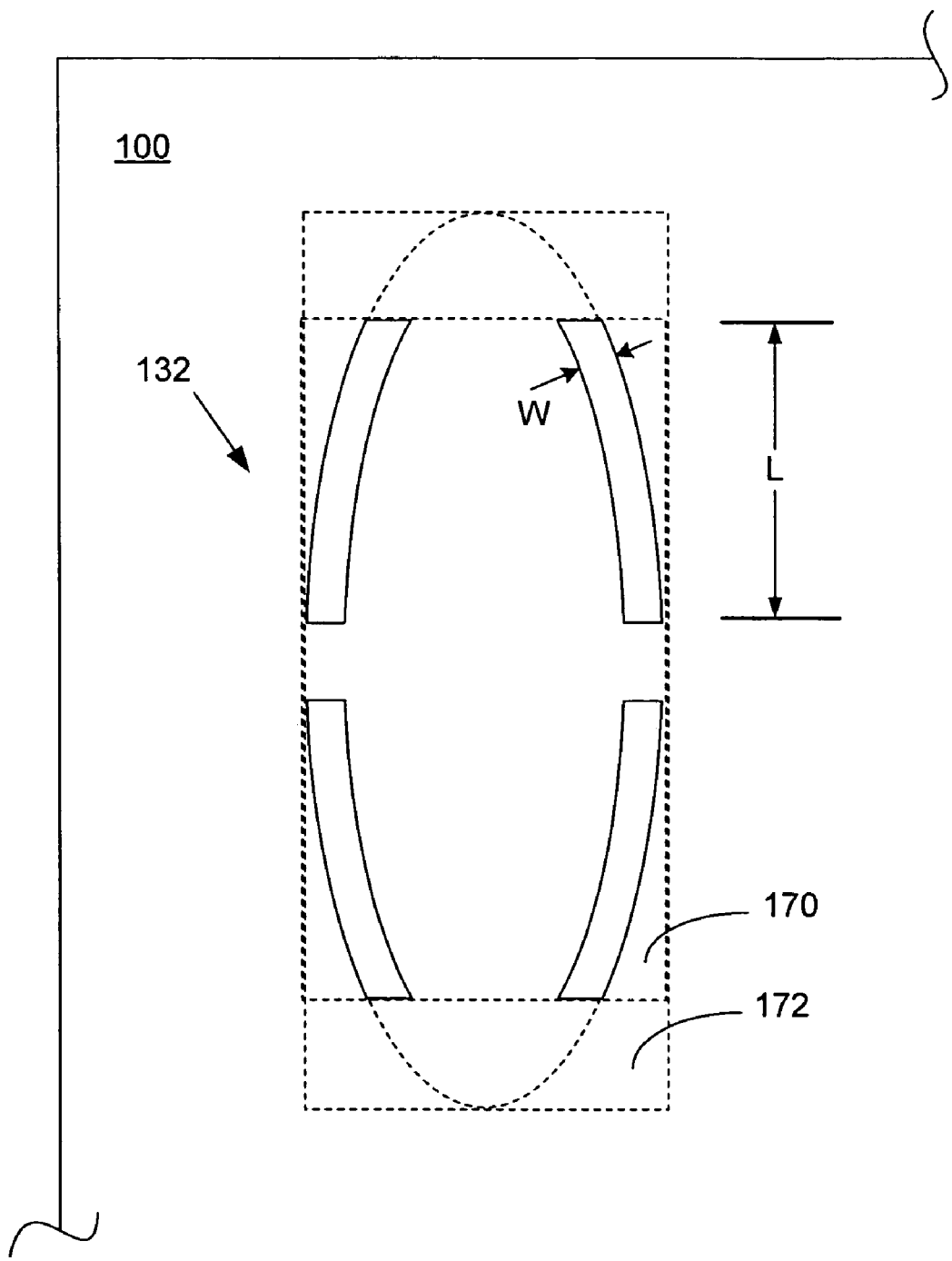

RIGID WAVE PATTERN DESIGN ON CHIP CARRIER SUBSTRATE AND PRINTED CIRCUIT BOARD FOR SEMICONDUCTOR AND ELECTRONIC SUB-SYSTEM PACKAGING

BACKGROUND OF THE INVENTION

1. Field of the Invention

Embodiments of the present invention relate to a method of forming a chip carrier substrate to alleviate chip cracking, and a chip carrier formed thereby.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of dice are mounted on a substrate. The substrate may in general include a rigid base having a conductive layer etched on one or both sides. Electrical connections are formed between the dice and the conductive layer(s), and the conductive layer(s) provide an electric lead structure for integration of the dice into an electronic system. Once electrical connections between the dice and substrate are made, the assembly is then typically encased in a molding compound to provide a protective package.

In view of the small form factor requirements, as well as the fact that flash memory cards need to be removable and not permanently attached to a printed circuit board, such cards are often built of a land grid array (LGA) package. In an LGA package, the semiconductor dice is electrically connected to exposed contact fingers formed on a lower surface of the package. External electrical connection with other electronic components on a host printed circuit board is accomplished by bringing the contact fingers into pressure contact with complementary electrical pads on the printed circuit board. LGA packages are ideal for flash memory cards in that they have a smaller profile and lower inductance than pin grid array (PGA) and ball grid array (BGA) packages.

A cross-section of a conventional LGA package is shown in FIG. 1. One or more die 20 are mounted on a substrate 22 via die attach 24. The substrate 22 in general is formed of a rigid core 26, of for example polyimide laminate. Thin film copper layers 28 may be formed on the core in a desired electrical lead pattern, including exposed surfaces for the contact fingers, using known photolithography and etching processes. The contact fingers 30 may be formed of a layer of gold deposited on the copper layer 28 to provide the electrical connection of the package to the host PCB. The dice may be electrically connected to the substrate by wire bonds 32. Vias (not shown) are formed through the substrate to allow electrical connection of the dice through the substrate to the contact fingers 30. The substrate may then be coated with a solder mask 34, leaving the contact fingers 30 exposed, to insulate and protect the electrical lead pattern form on the substrate. Further examples of typical LGA packages are disclosed in U.S. Pat. Nos. 4,684,184, 5,199,889 and 5,232,372, which patents are incorporated by reference herein in their entirety.

Referring now to FIG. 2, after the dice is mounted onto the substrate, the assembly is packaged within a molding compound 40 to protect the assembly. During the molding process, the molding machine may output an injection force typically about 0.8 tons to drive the molding compound into the mold cavity. For dice having a footprint of about 4.5 mm by 2.5 mm, this injection force may result in a pressure down on the dice of about 1.2 kgf/mm².

The bottom surface of an LGA package is typically not flat. As shown in FIGS. 1 and 2, the fingers 30 are recessed within the package, above the plane defined by the solder mask 34. The flush position of the solder mask results in an equal and opposite force pushing upward on the substrate, against the force of the mold compound, at positions beneath the lower surface solder mask. However, as the contact fingers are not flush with the lower surface of the solder mask, there is no equal and opposite force at positions beneath the contact fingers. This results in stress buildup within the dice at positions in the dice located over the contact fingers.

In the past, semiconductor die were better able to withstand the stress generated during the molding process in LGA packages. However, chip scale packages (CSP) and the constant drive toward smaller form factor packages require very thin dice. It is presently known to employ wafer backgrind during the semiconductor fabrication process to thin dice to a range of about 8 mils to 20 mils. At these thicknesses, the dice are often not able to withstand the stresses generated during the molding process, and the dice deform under the molding pressure (as shown by the dashed lines in FIG. 2).

Deformation of the dice over the contact fingers can cause fractures in the dice, known as die cracking, such as the die crack 50 shown in FIG. 2. Die cracking under the stress of the molding process will generally result in the package having to be discarded. Occurring at the end of the semiconductor fabrication and packaging process, this is an especially costly and burdensome problem.

The problem of die cracking has not previously been addressed by the chip carrier substrates. The area on the top side of the substrate, above the contact fingers on the bottom side of the substrate, generally include layer 28 of copper, etched for example in a mesh pattern as shown in prior art FIG. 3. It is also known to provide a solid uniform layer of copper above the contact fingers as shown in prior art FIG. 4. However, owing to differences in thermal expansion coefficients, a solid uniform layer of copper on the substrates leads to warping and other problems during the elevated temperature processes during package formation. Moreover, with thin semiconductor die, die cracking occurs at unacceptably high rates during the molding process with either one of the patterns shown in FIGS. 3 and 4.

SUMMARY OF THE INVENTION

One embodiment of the invention relates to a strengthened semiconductor die package. The semiconductor die package is formed of one or more semiconductor die mounted on a substrate, and a molding compound for encapsulating the one or more semiconductor die and substrate. The substrate includes first and second conductive layers, in one or both of which are formed electrical conductance patterns. A portion of the conductance pattern on a first of the conductive layers is formed into contact fingers for electrical connection of the die package to external components. The second conductive layer includes a pattern, referred to herein as a rigid wave pattern, for reducing deformation and stress on the one or more die otherwise resulting from the contact fingers during the molding process.

In embodiments of the invention, the rigid wave pattern is formed in a first surface of the substrate to align with and overlie the contact fingers formed on the opposite surface of the substrate. The rigid wave pattern may include etched portions and an unetched portion surrounding the etched portions. There may be one etched portion for each contact finger, and each etched portion is approximately the same size as its corresponding contact finger in the opposite surface of the substrate.

In an embodiment of the present invention, each of the etched portions may have four distinct sections, which together form a portion of an ellipse, truncated at the top and bottom, and separated at its middle between the top and bottom. The unetched portion surrounding the etched portions may be generally rectangular in shape and devoid of etching. The shape of the etched and unetched portions of the rigid wave pattern may vary in alternative embodiments.

With the one or more die overlying some or all of the contact fingers when mounted on the substrate, the rigid wave pattern according to embodiments of the present invention effectively reduces deformation of and stresses on the individual dice, therefore substantially alleviating die cracking. Moreover, the etched portions of rigid wave pattern may be formed at the same time and in the same process as the electrical conductance patterns on the substrate. Thus, the advantages provided by the present invention may be achieved without any additional processing steps or any additional fabrication costs.

BRIEF DESCRIPTION OF THE DRAWINGS

FIG. 5 is a top view of a chip carrier substrate, looking through the top surface to the contact fingers on the bottom surface (the contact fingers on the bottom surface being shown in phantom).

FIG. 6 is a top view of a chip carrier substrate, the top surface including a rigid wave pattern according to embodiments of the present invention.

FIG. 7 is a cross-sectional view through line 7-7 in FIG. 6.

FIG. 8 is a cross-sectional view through line 8-8 in FIG. 6.

FIG. 9 is an enlarged top view of a portion of a rigid wave pattern according to embodiments of the present invention.

DETAILED DESCRIPTION

Figure 1:
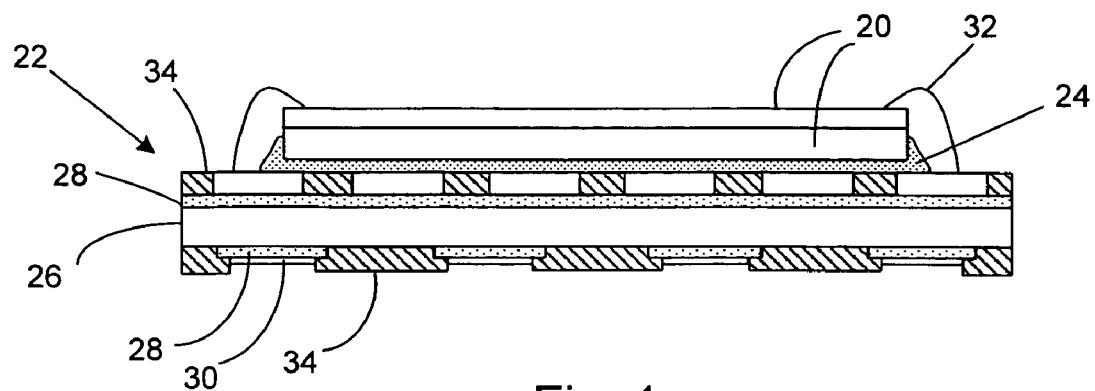
FIG. 1 is a prior art cross-sectional view of a dice mounted on a substrate in a LGA package.
Figure 2:
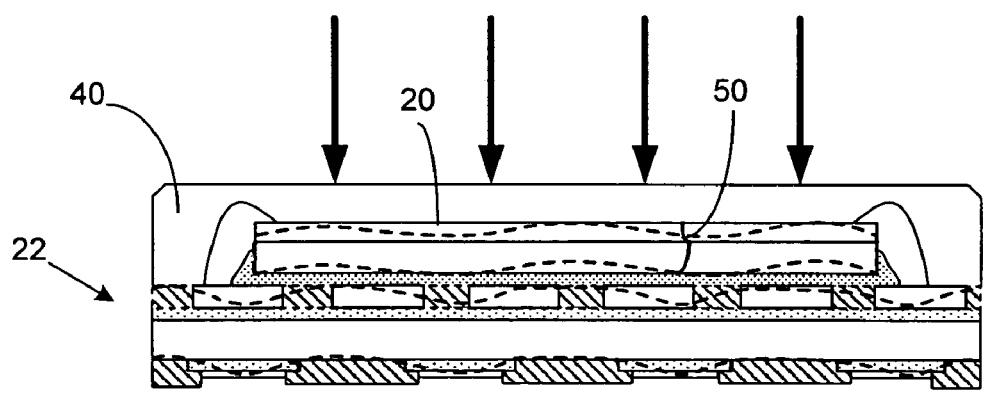
FIG. 2 is a prior art cross-sectional view of the packaged dice and substrate, where the die have cracked as a result of pressure during the molding process.
Figure 3:
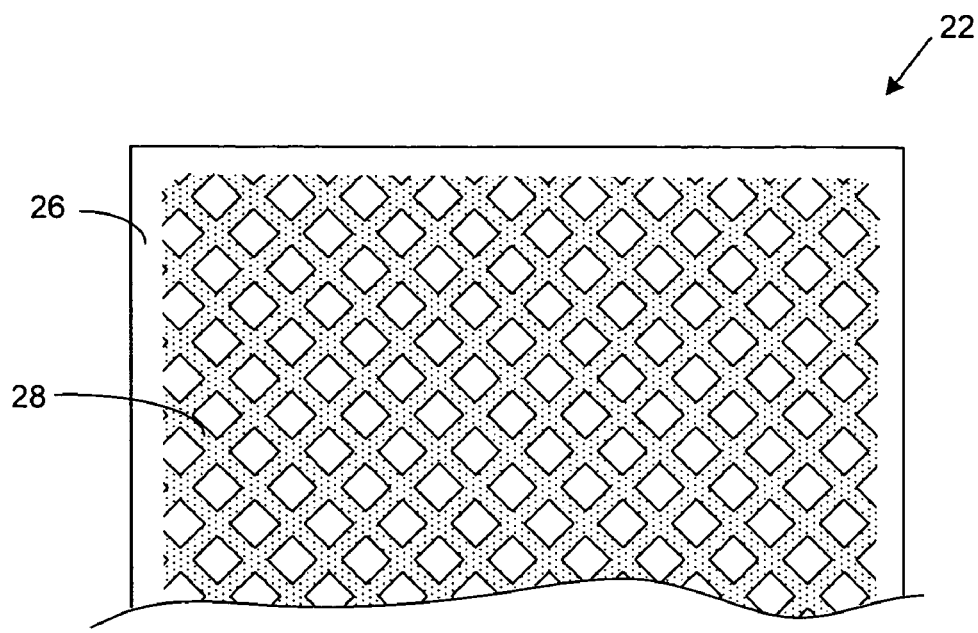
FIG. 3 is a prior art top view of an un-etched copper layer formed on the upper surface of a conventional chip carrier substrate.
Figure 4:
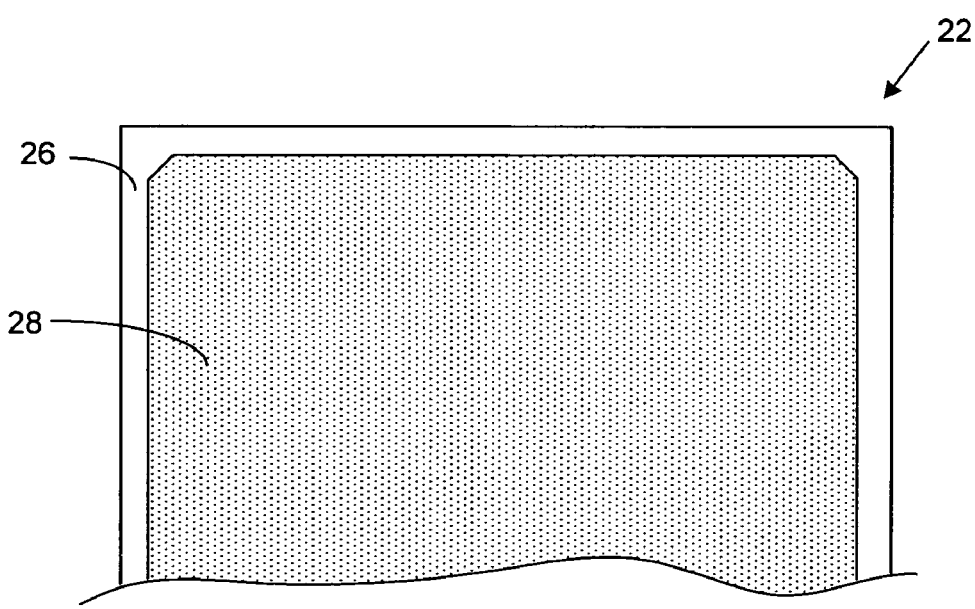
FIG. 4 is a prior art top view of a mesh-patterned copper layer formed on the upper surface of a conventional chip carrier substrate.

Embodiments of the invention will now be described with reference to FIGS. 5 through 18, which relate to a strengthened semiconductor package. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

FIGS. 5 and 6 are top views of a portion of a chip carrier substrate 100, and FIGS. 7 and 8 are cross-sectional views through different planes normal to the top and bottom surfaces of the substrate 100. As seen in FIGS. 7 and 8, the substrate 100 may have a top surface 102 and a bottom surface 104. Substrate 100 may be formed of a core 106, having a top conductive layer 108 formed on a top surface of the core, and a bottom conductive layer 110 formed on the bottom surface of the core. The core may be a dielectric material, for example an epoxy-glass resin such as BT resin and may have a thickness of between about 40 microns (μm) to 200 μm, although the thickness of the core may vary outside of that range in alternative embodiments. The core may be ceramic or organic in alternative embodiments.

The conductive layers 108 and 110 may be formed of copper or other low resistance electrical conductor, and may be patterned as explained hereinafter. The layers 108 and 110 may have a thickness of about 10 μm to 24 μm, although the thickness of the layers 108 and 110 may vary outside of that range in alternative embodiments. Once patterned, the top and bottom conductive layers may be laminated with a solder mask 112 as is known in the art, and one or more gold layers may be formed on portions of the bottom conductive layer 110 to define contact fingers 114 as is known in the art. Substrates including conductive layers which may be patterned in accordance with the present invention are available from Kinsus Interconnect Technology Corp., Santa Clara, Calif.

In embodiments of the invention, substrate 100 may be patterned and configured for use in an LGA semiconductor package. It is understood that the substrate 100 and the rigid wave pattern explained hereinafter may be used in other types of semiconductor packages, including for example BGA packages.

FIGS. 5, 7 and 8 further show two stacked semiconductor die 116 mounted on the top surface 102 of the substrate 100 (shown in phantom in the top view of FIG. 5 and omitted from the top view of FIG. 6 for clarity). Embodiments of the invention may alternatively include a single dice, and embodiments of the invention may alternatively include between 3 and 8 or more die stacked in an SiP, MCM or other type of arrangement. The one or more die may have thicknesses ranging between 8 mils to 20 mils, but the one or more die may be thinner than 8 mils and thicker than 20 mils in alternative embodiments. While not critical to the present invention, the one or more die 116 may be a flash memory chip (NOR/NAND), SRAM or DDT, and/or a controller chip such as an ASIC. Other silicon chips are contemplated.

The one or more die 116 may be mounted on the top surface 102 of the substrate 100 in a known adhesive or eutectic die bond process, using a known die attach compound 118. The die attach compound may be for example any of various polymer adhesives containing conductive fillers for electrical conductivity. Such die attach compounds are manufactured for example by Semiconductor Packaging Materials, Inc. of Armonk, N.Y. The one or more die 116 may be electrically connected to conductive layers 108, 110 of the substrate 100 by wire bonds 120 in a known wire bond process.

Although not visible from the top surface of the chip carrier substrate, FIG. 5 shows a top view in phantom of the positions of contact fingers 114 formed on the bottom surface 104 of the substrate 100. The contact fingers 114 are provided to establish an electrical connection in a known manner with contact pads of a host printed circuit board (not shown), or other electronic component, when the contact fingers 114 are brought into pressure contact against the contact pads of the host printed circuit board. While four contact fingers 114 are shown, it is understood that there may be more or less than four fingers in alternative configurations of the chip carrier substrate 100. In an embodiment, there may be eight contact fingers.

Other portions of an electrical conductance pattern may be formed on the upper and/or lower surfaces 102, 104 of the substrate in a known manner and as explained hereinafter to provide electrical connections between the one or more die 116, contact fingers 114 and/or other electronic components mounted on the surfaces of substrate 100. In embodiments, aside from the rigid wave pattern and the contact fingers, there may be an electrical conductance pattern 208 (FIG. 15) on one or both surfaces of the substrate 100. In embodiments including conductance patterns on both the top surface 102 and bottom surface 104, vias (not shown) may be provided to transmit electrical signals between the top and bottom surfaces of the substrate 100.

As indicated in the Background of the Invention section, for thin die, the pressure applied during the molding process often mechanically stresses the die to the point where die cracking occurs. In order to prevent die cracking during the molding process, the present invention employs an etched pattern, referred to herein as a rigid wave pattern, or "RWP," on the substrate. An embodiment of a rigid wave pattern 130 is shown in the view of the top surface 102 of substrate 100 in FIG. 6. In embodiments of the invention, the rigid wave pattern 130 is formed on the top surface 102 to align with and overlie the contact fingers 114 formed on the opposite surface of the substrate 100. The rigid wave pattern 130 includes etched portions 132-138, and unetched portion 140 surrounding the etched portions 132-138. In the configuration of the substrate 100 shown, there are four contact fingers 114, and accordingly, rigid wave pattern 130 has four corresponding RWP etched portions, one corresponding to each of the contact fingers. In configurations where there are more or less contact fingers, embodiments of the invention include correspondingly more or less RWP etched portions. In an embodiment including eight contact fingers, there may be eight corresponding RWP etched portions. However, it is understood that there may be more or less RWP etched portions than there are contact fingers in alternative embodiments of the invention.

The RWP etched portions of rigid wave pattern 130 may be formed at the same time and in the same process as the electrical conductance pattern 208 on the upper surface 102. Thus, the advantages provided by the present invention may be achieved without any additional processing steps or any additional fabrication costs. It is understood, however, that the rigid wave pattern may be formed of known plating materials as a separate layer on one of the layers 108 and/or 110 in alternative embodiments. There are a number of known processes for forming the RWP etched portions. One process for forming the RWP etched portions as well as the electrical conductance pattern 208 on the substrate 100 is explained with reference to the flow chart of FIG. 14. The surfaces of conductive layers 108 and 110 are cleaned in step 150. A photoresist film is then applied over the surfaces of layers 108 and 110 in step 152. A pattern mask containing the outline of the electrical conductance pattern and rigid wave pattern is then placed over the photoresist film in step 154. The photoresist film is exposed (step 156) and developed (step 158) to remove the photoresist from areas on the conductive layers that are to be etched. The exposed areas are next etched away using an etchant such as ferric chloride in step 160 to define the conductance and rigid wave patterns on the core. Next, the photoresist is removed in step 162, and the solder mask layer is applied in step 164.

In an embodiment of the present invention, each of the RWP etched portions 132-138 has an overall width approximately equal to the width of each of the contact fingers 114, and an overall length approximately equal to the length of each of the contact fingers 114. Each RWP etched portion 132-138 includes four distinct sections, which together form a portion of an ellipse, truncated at the top and bottom, and separated at its middle between the top and bottom. Assuming a length, L (FIG. 9), parallel to the length of the contact fingers, the length L of each of the four distinct sections of an RWP etched portion may be approximately one-third the length of a contact finger. The width, W, of each section of an RWP etched portion may be approximately 50 μm. It is understood that the length, L, and width, W, may be lesser or greater than the values set forth above in alternative embodiments.

FIG. 9 is an enlarged view of a single RWP etched portion, for example, RWP etched portion 132. In embodiments, each of the RWP etched portions 132-138 may be the same size and configuration as each other, but it is understood that RWP etched portions 132-138 may be sized differently than each other in alternative embodiments. FIG. 9 shows RWP etched portion 132 and two rectangles in phantom. The smaller rectangle, rectangle 170, is the size of a contact finger 114, over which the RWP etched portion 132 lies on the substrate as explained hereinafter with reference to FIG. 12. The larger rectangle, rectangle 172 is the rectangle having an overall width and length of an ellipse (shown in phantom) defined by the outer edges of RWP etched portion 132 (i.e., if the top and bottom portions of RWP etched portion 132 were not truncated, it would form an ellipse having a width and length of rectangle 172). In embodiments of the present invention, the rectangles 170 and 172 have the same width. That is, the width of the RWP etched portion 132 is the same as the width of the contact finger 114. In embodiments of the present invention, rectangle 172 may range in size from about the same size as rectangle 170 to a rectangle have a length of approximately 4.9 mm and a width of approximately 1.65 mm. It is understood that the size of rectangle 172 may be slightly larger or smaller than the range set forth above in alternative embodiments.

In an embodiment of the invention, the RWP unetched portion 140 surrounding each of the RWP etched portions 132-138 is generally rectangular in shape and devoid of etching. In a first embodiment, the size of the rectangle defined by the RWP unetched portion 140 may be as small as a rectangle just encompassing each of the RWP etched portions together. In a second embodiment, the RWP unetched portion 140 may extend in a first direction to the left edge of the conductive layer 108, in a second direction to the right edge of the conductive layer 108, in a third direction to a top edge of the conductive layer adjacent the RWP etched portions, and in a fourth direction extending down to a boundary just above a circuitry pattern formed on the top surface 102 of the substrate 100. In further alternative embodiments, the size of the etched portion may range in size anywhere between the above-described first and second embodiments. In an embodiment where there is no circuitry on the top surface of the substrate, the RWP unetched portion may extend down to the bottom edge of the conductive layer 108.

It is understood that the shape of RWP unetched portion 140 may be other than rectangular in alternative embodiments. For example, it may be oval, elliptical, circular, or some other irregular shape encompassing the RWP etched portions.

Figure 10:
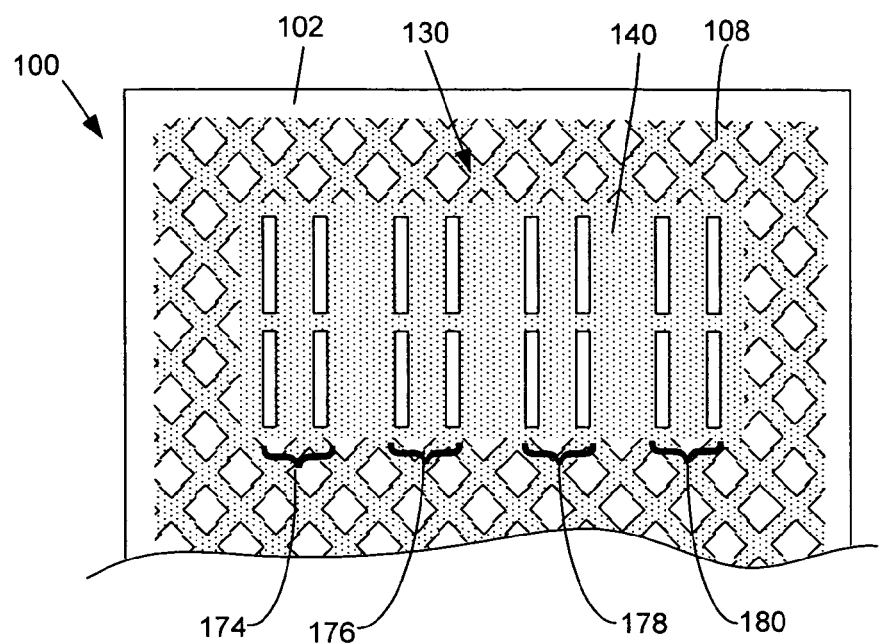
FIGS. 10-13 are top views of a chip carrier substrate, the top surface including rigid wave patterns according to alternative embodiment of the present invention.
Figure 11:
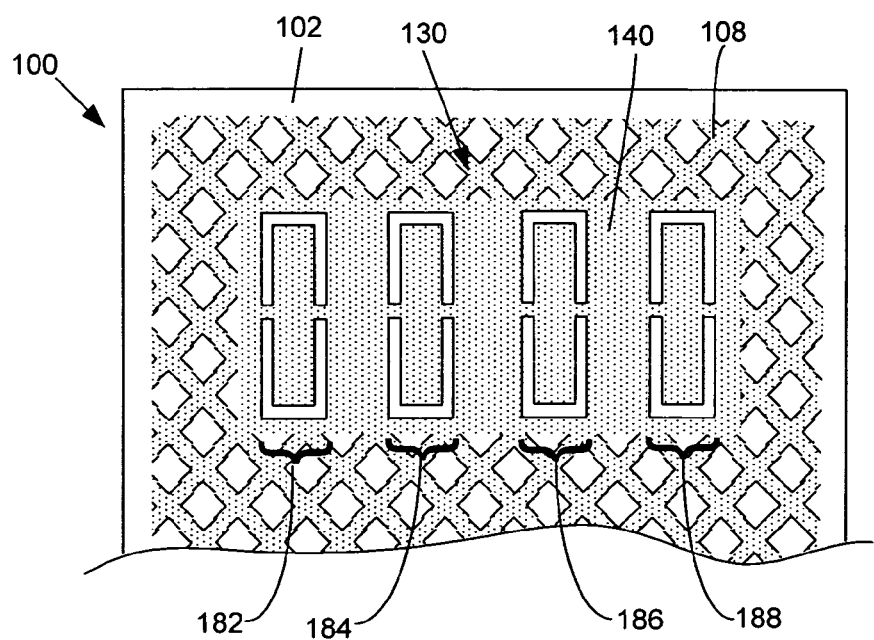
Figure 12:
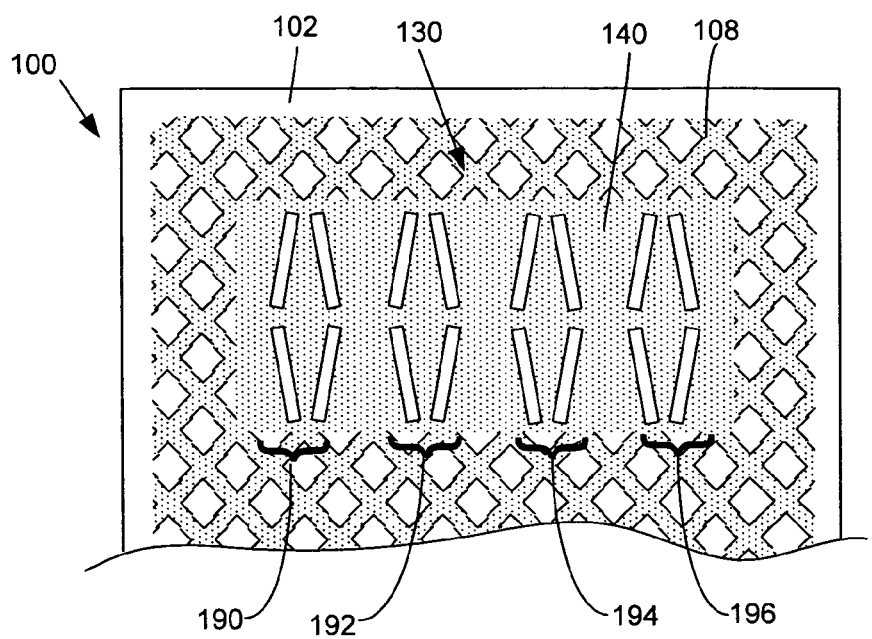
Figure 13:
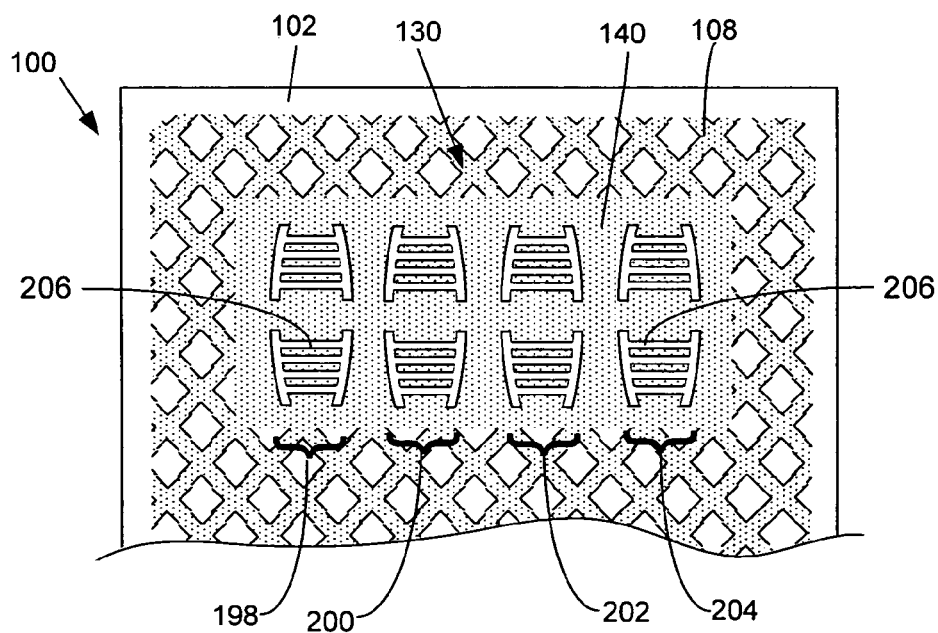
Figure 14:
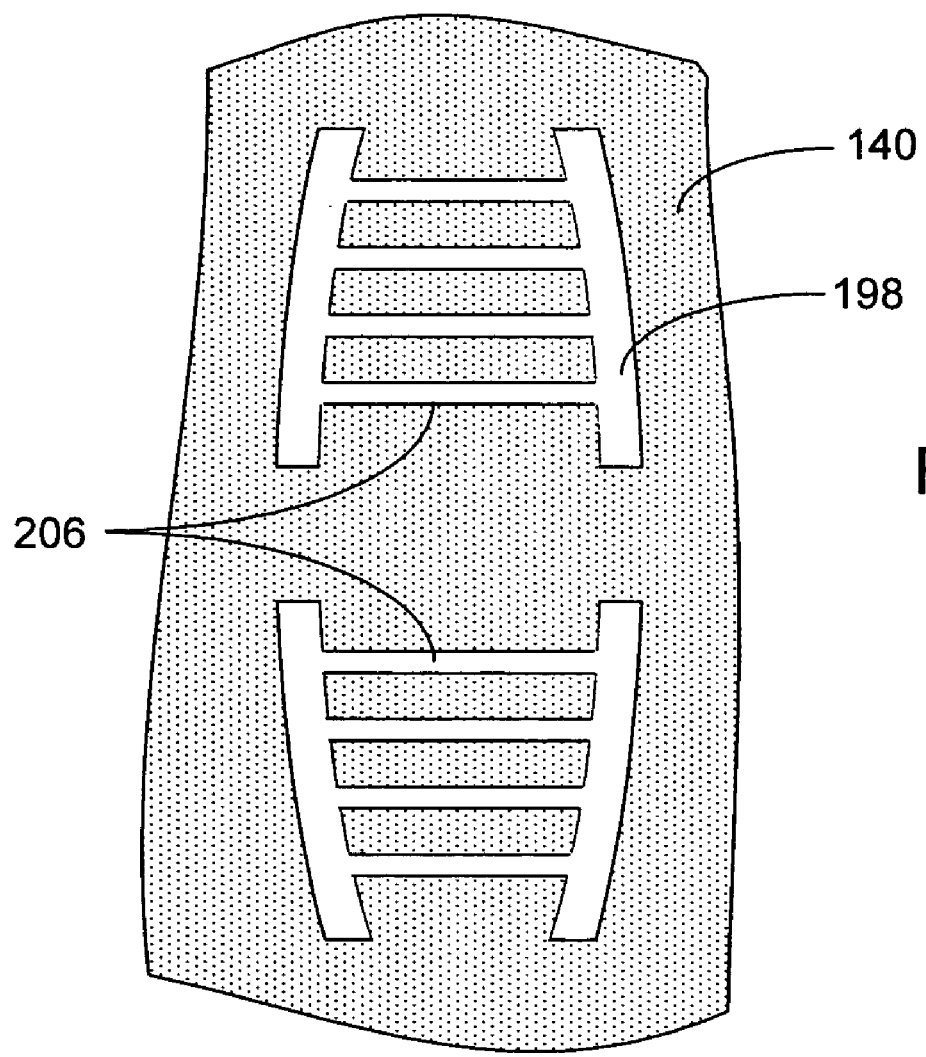
FIG. 14 is an enlarged top view of a portion of a chip carrier substrate, the top surface including a rigid wave pattern as shown in FIG. 13.

It is also understood that the RWP etched pattern may vary from the partial ellipse shape shown in FIGS. 6 and 9. For example, FIG. 10 shows RWP etched patterns 174-180 having straight edges, each pattern 174-180 having a length and width overlying and approximately the same shape as the contact fingers 114. The RWP etched patterns may alternatively be generally rectangular shaped, such as RWP etched patterns 182-188 shown in FIG. 11. The center of RWP etched patterns 182-188 as shown in FIG. 11 are not etched. It is understood that the centers of RWP etched patterns 182-188 may be etched in alternative embodiments. A further embodiment is shown in FIG. 12 where each of the RWP etched patterns 190-196 has top and bottom lengths inclined toward each other in a triangular shape. The inclined lengths may come together at their top and bottom or may be separated from each other (as shown). A still further embodiment is shown in FIG. 13 and the enlarged view of FIG. 14. RWP etched patterns 198-204 are shown including lateral thermal relief etchings 206 extending between the lengthwise sections of the RWP etched pattern. Thermal relief etchings may be used in embodiments to reduce mechanical stresses within the layers of the substrate generated by the differing thermal expansion coefficients of the layer 108 and core 106. The number and width of thermal relief etchings 206 across the length of the RWP etched patterns may vary in alternative embodiments. The thermal relief etchings 206 may be used in any of the above-described embodiments. It is understood that RWP etched patterns may have other shapes in alternative embodiments.

Figure 15:
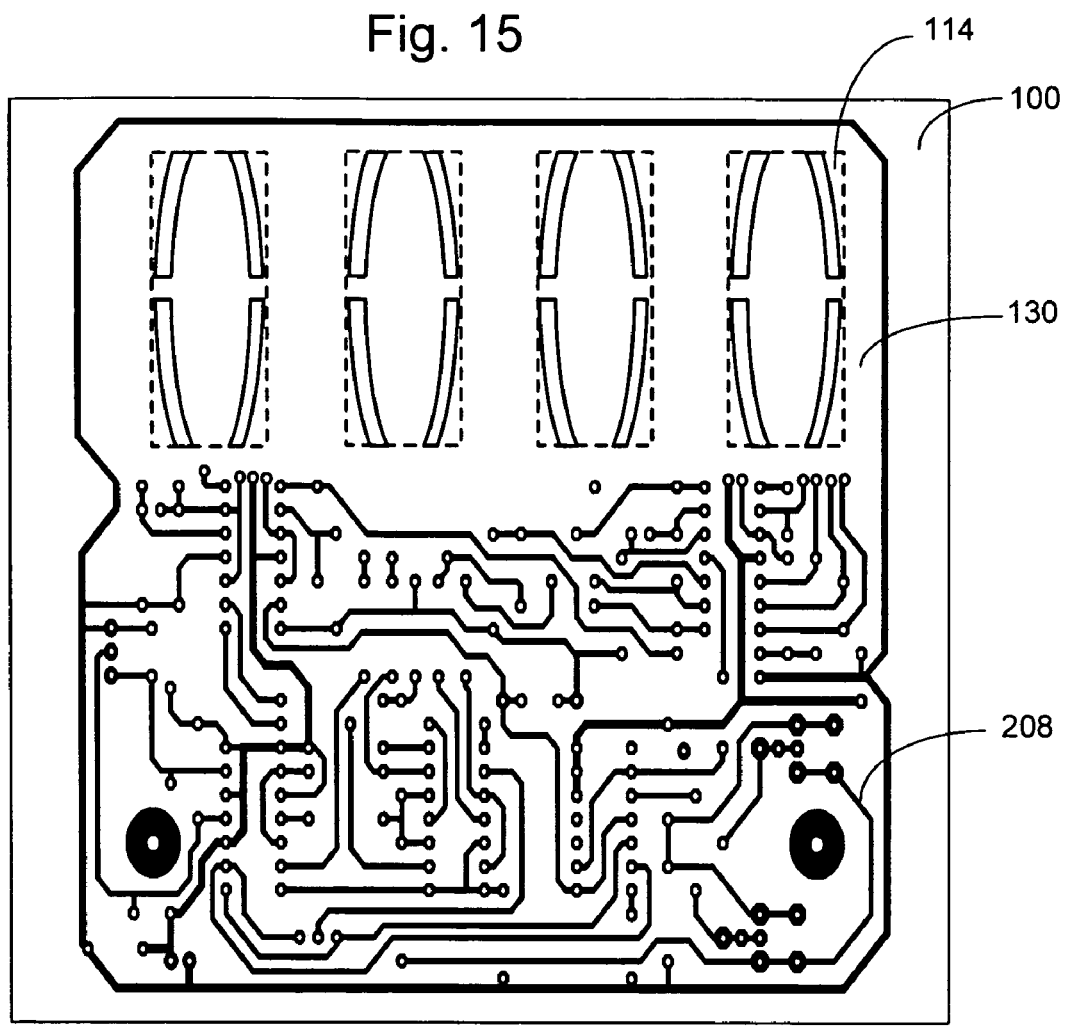
FIG. 15 is a top view of a chip carrier substrate, the top surface including a conductance pattern and a rigid wave pattern according to embodiments of the present invention.

FIG. 15 is a top view of chip carrier substrate 100 including a conductance pattern 208 and a rigid wave pattern 130 according to an embodiment of the present invention. The contact fingers 114, on the bottom surface of the substrate 100, are also shown in phantom. As shown, each of the RWP etched portions aligns with and resides over a respective contact finger 114. It is understood that the contact fingers 114 may be formed at other locations on the substrate, and the rigid wave pattern moved accordingly to overlie the fingers.

With the one or more die overlying some or all of the contact fingers when mounted on the substrate, the rigid wave pattern according to embodiments of the present invention effectively reduces deformation of and stresses on the individual dice, therefore substantially alleviating die cracking.

Moreover, while the rigid wave pattern according to embodiments of present invention has been described as being positioned over the contact fingers on opposed sides of the substrate to reduce the mechanical stresses on the semiconductor dice mounted at least partially over the contact fingers and rigid wave pattern, it is understood that the rigid wave pattern may be used over other portions of the conductance pattern to reduce mechanical stresses on other components on substrate 100. In such embodiments, the rigid wave pattern may be formed on an opposite side of a portion of the conductance pattern, in a shape that aligns with and compliments the portion of the conductance pattern as set forth above, so as to lessen mechanical stress on a component mounted on the substrate over the rigid wave pattern and portion of the conductance pattern.

Figure 16:
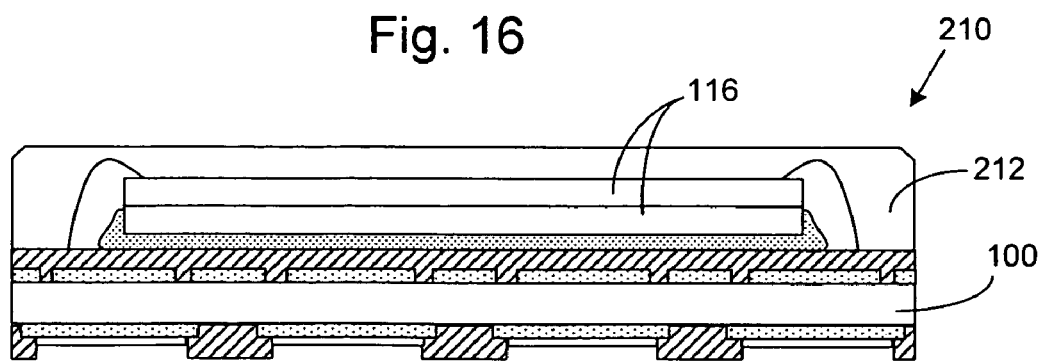
FIG. 16 is a side cross-sectional view of a semiconductor package including a dice and a chip carrier substrate having a rigid wave pattern according to an embodiment of the present invention.
Figure 17:
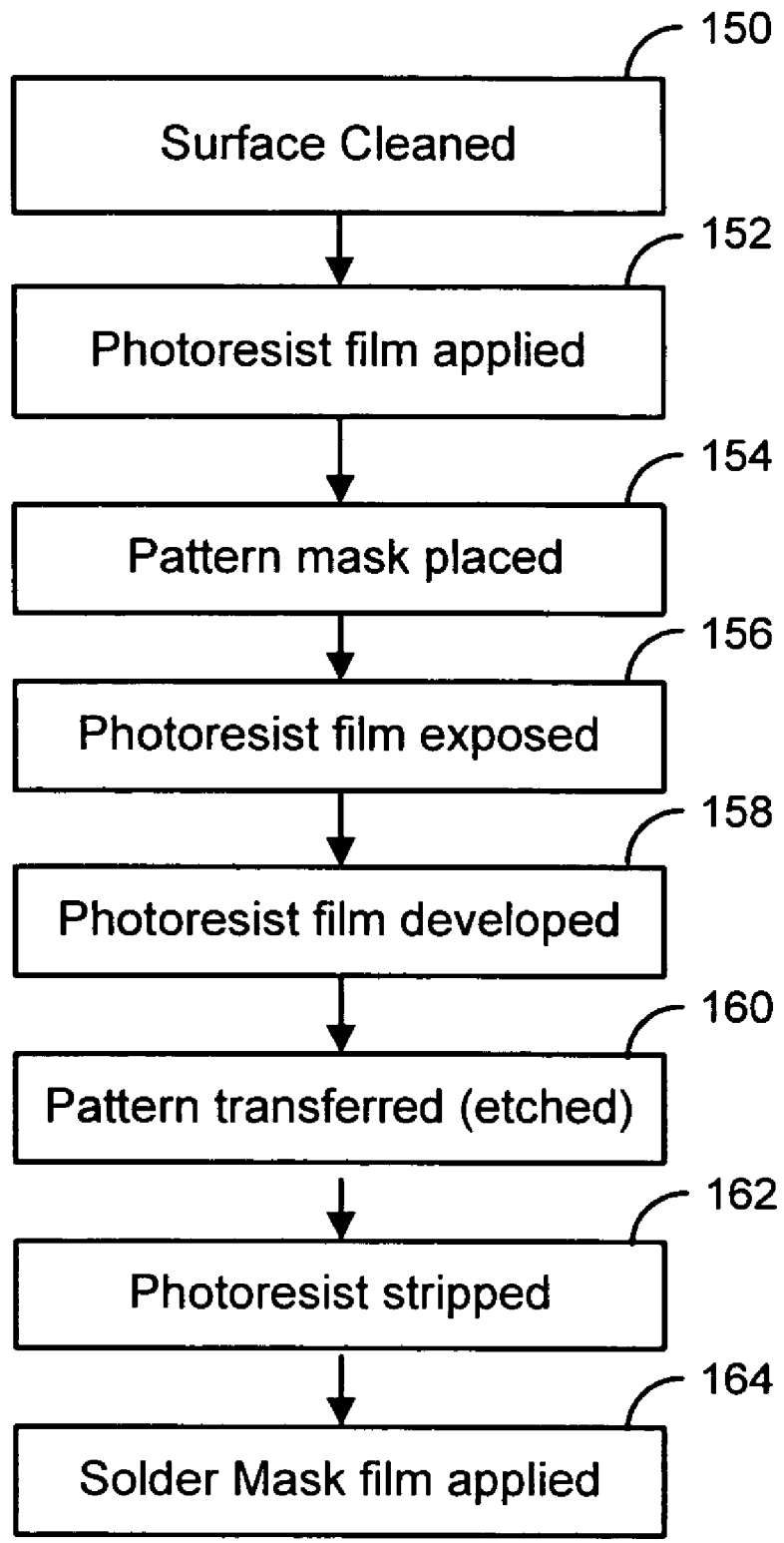
FIG. 17 is a flowchart of a process for forming a rigid wave pattern on a substrate according to the present invention.
Figure 18:
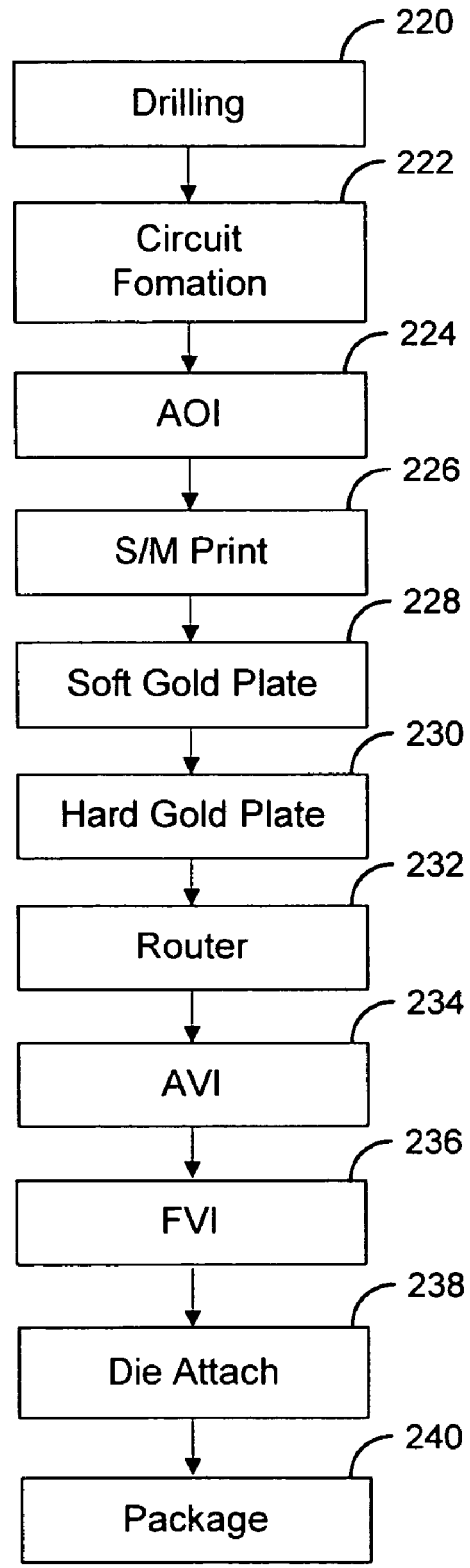
FIG. 18 is a flow chart illustrating the manufacturing process of a chip carrier substrate according to the present invention.

FIG. 16 is a cross-sectional side view of a finished semiconductor die package 210 having substrate 100 with a rigid wave pattern and dice 116 encased within molding compound 212. A process for forming the finished die package 210 is explained with reference to the flow chart of FIG. 18. The substrate 100 starts out as a large panel which is separated into individual substrates after fabrication. In a step 220, the panel is drilled to provide reference holes off of which the position of the respective substrates is defined. The conductance pattern and rigid wave pattern are then formed on the respective surfaces of the panel in step 222 as explained above. The patterned panel is then inspected in an automatic optical inspection (AOI) in step 224. Once inspected, the solder mask is applied to the panel in step 226.

After the solder mask is applied, the contact fingers are completed. A soft gold layer is applied over certain exposed surfaces of the conductive layer on the bottom surface of the substrate, as for example by thin film deposition, in step 228. As the contact fingers are subject to wear by contact with external electrical connections, a hard layer of gold may be applied, as for example by electrical plating, in step 230. It is understood that a single layer of gold may be applied in alternative embodiments. A router then separates the panel into individual substrates in step 232. The individual substrates are then inspected and tested in an automated step (step 234) and in a final visual inspection (step 236) to check electrical operation, and for contamination, scratches and discoloration. The substrates that pass inspection are then sent through the die attach process in step 238, and the substrate and dice are then packaged in step 240 in a known injection mold process to form a JEDEC standard (or other)

package. It is understood that the die package 210 including a rigid wave pattern may be formed by other processes in alternative embodiments.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A first pattern formed of an electrical connector on a first surface of a substrate, the substrate capable of supporting and electrically connecting to a semiconductor dice, a second surface of the substrate opposite the first surface including a second pattern, the first pattern comprising:
   an etched portion;
   an unetched portion surrounding the etched portion, the first pattern for reducing a mechanical stress generated by the second pattern on the semiconductor dice during a molding process;
   wherein the etched portion of the first pattern on the first surface of the substrate aligns with and overlies a portion of the second pattern;
   wherein the portion of the second pattern is a contact finger for forming an external electrical connection; and
   wherein the etched portion of the first pattern forms a portion of an ellipse, said ellipse having a width approximately equal to a width of the contact finger, and said ellipse having a length greater than or equal to a length of the contact finger.

2. A first pattern as recited in claim 1, the portion of the ellipse having a width approximately equal to a width of the contact finger, and the portion of the ellipse having a length approximately equal to a length of the contact finger.

3. A first pattern formed of an electrical connector on a first surface of a substrate, the substrate capable of supporting and electrically connecting to a semiconductor dice, a second surface of the substrate opposite the first surface including a second pattern, the first pattern comprising:
   an etched portion;
   an unetched portion surrounding the etched portion, the first pattern for reducing a mechanical stress generated by the second pattern on the semiconductor dice during a molding process;
   wherein the etched portion of the first pattern on the first surface of the substrate aligns with and overlies a portion of the second pattern;
   wherein the portion of the second pattern is a contact finger for forming an external electrical connection; and
   wherein the etched portion of the first pattern includes a pair of etched sections aligned generally along a length of the etched portion, and lateral etched sections extending laterally between the pair of etched sections.

4. A rigid wave pattern formed on a first surface of a substrate, the substrate capable of supporting and electrically connecting to a semiconductor dice, a second surface of the substrate opposite the first surface including one or more contact fingers for making one or more external electrical connections, the rigid wave pattern comprising:
   one or more etched portions on the first surface, an etched portion of the one or more etched portions forming a portion of an elipse overlying a contact finger of the one or more contact fingers on the second surface, said ellipse having a width approximately equal to a width of the contact finger, and said ellipse having a length greater than or equal to a length of the contact finger; and
   an unetched portion surrounding the one or more etched portions, the rigid wave pattern capable of reducing a mechanical stress generated by the contact finger on the semiconductor dice during a molding process.

5. The rigid wave pattern as recited in claim 4, the substrate including:
   a core having a first surface and a second surface opposite the first surface;
   a first conductive layer formed on the first surface of the core, the rigid wave pattern being formed in the first conductive layer; and
   a second conductive layer formed on the second surface of the core, the one or more contact fingers being formed in the second conductive layer.

6. The rigid wave pattern as recited in claim 4, wherein the rigid wave pattern is formed in a copper layer of the substrate.

7. The rigid wave pattern as recited in claim 4, wherein the unetched portion of the rigid wave pattern is rectangular in shape.

8. A rigid wave pattern formed on a first surface of a substrate, the substrate capable of supporting and electrically connecting to a semiconductor dice, a second surface of the substrate opposite the first surface including one or more contact fingers for making one or more external electrical connections, the rigid wave pattern comprising:
   one or more etched portions on the first surface, an etched portion of the one or more etched portions forming a portion of an ellipse overlying a contact finger of the one or more contact fingers on the second surface, said ellipse having a width approximately equal to a width of the contact finger, and said ellipse having a length greater than or equal to a length of the contact finger; and
   an unetched portion surrounding the one or more etched portions, the rigid wave pattern capable of reducing a mechanical stress generated by the contact finger on the semiconductor dice during a molding process;
   said portion of the ellipse having a width approximately equal to a width of the contact finger, and portion of the ellipse having a length approximately equal to a length of the contact finger.

9. A rigid wave pattern formed on a first surface of a substrate, the substrate capable of supporting and electrically connecting to a semiconductor dice, a second surface of the substrate opposite the first surface including one or more contact fingers for making one or more external electrical connections, the rigid wave pattern comprising:
   one or more etched portions on the first surface, an etched portion of the one or more etched portions including a pair of etched sections aligned generally along a length of the etched portion and lateral etched sections extending laterally between the pair of etched sections, and overlying a contact finger of the one or more contact fingers on the second surface; and
   an unetched portion surrounding the one or more etched portions, the rigid wave pattern capable of reducing a mechanical stress generated by the contact finger on the semiconductor dice during a molding process.

10. The rigid wave pattern as recited in claim 9, the substrate including:

a core having a first surface and a second surface opposite the first surface;

a first conductive layer formed on the first surface of the core, the rigid wave pattern being formed in the first conductive layer; and a second conductive layer formed on the second surface of the core, the one or more contact fingers being formed in the second conductive layer.

11. The rigid wave pattern as recited in claim 9, wherein the rigid wave pattern is formed in a copper layer of the substrate.

12. The rigid wave pattern as recited in claim 9, wherein the unetched portion of the rigid wave pattern is rectangular in shape.

* * * * *